United States Patent
Parris

(10) Patent No.: US 8,736,278 B2
(45) Date of Patent: May 27, 2014

(54) SYSTEM AND METHOD FOR TESTING FUSE BLOW RELIABILITY FOR INTEGRATED CIRCUITS

(75) Inventor: Michael Curtis Parris, San Jose, CA (US)

(73) Assignee: Tessera Inc., San Jose, CA (US)

( * ) Notice: Subject to any disclaimer, the term of this patent is extended or adjusted under 35 U.S.C. 154(b) by 349 days.

(21) Appl. No.: 13/194,669

(22) Filed: Jul. 29, 2011

(65) Prior Publication Data
US 2013/0027056 A1    Jan. 31, 2013

(51) Int. Cl.
*G01R 31/07*    (2006.01)

(52) U.S. Cl.
USPC .......................................... 324/550; 324/507

(58) Field of Classification Search
USPC ............ 324/537, 550, 507; 257/529; 365/200
See application file for complete search history.

(56) References Cited

U.S. PATENT DOCUMENTS

| | | | |
|---|---|---|---|
| 6,882,202 B2 | 4/2005 | Lehmann et al. | |
| 2002/0047181 A1* | 4/2002 | Hasegawa | 257/529 |
| 2004/0257886 A1* | 12/2004 | Adams et al. | 365/200 |
| 2006/0197178 A1 | 9/2006 | Chung | |

* cited by examiner

*Primary Examiner* — Vincent Q Nguyen

(57) ABSTRACT

System and method for testing the reliability of a fuse blow condition. The fuse blow detection circuit includes a fuse circuit comprising a fuse having a first end coupled to ground. A common node is coupled to the second end of the fuse. A pre-charge circuit is coupled to the common node for pre-charging the common node to a pre-charged HIGH level. An inverter includes an inverter output and an inverter input, wherein the inverter input is coupled to the common node. A feedback latch is coupled between a voltage source and ground, and includes a latch input that is coupled to the inverter output and a latch output coupled to the common node. A test circuit is included that is coupled to the common node, wherein in a normal mode the test circuit adds strength to the feedback latch for purposes of maintaining the common node at the pre-charged HIGH level, such that in a test mode the feedback latch is weaker than in the normal mode for purposes of maintaining the common node at the pre-charged HIGH level.

21 Claims, 5 Drawing Sheets

| FUSE CONDITION (RESISTANCE VALUE) | NORMAL MODE (COMMON NODE STATUS) | TEST MODE (COMMON NODE STATUS) |
|---|---|---|
| NO BLOW (LOW RESISTANCE) | SET (LOW) | SET (LOW) |
| WEAK OR PARTIAL BLOW (MEDIUM RESISTANCE) | NOT SET (HIGH) | SET (LOW) |
| | SET (LOW) | — |
| STRONG BLOW (HIGH RESISTANCE) | NOT SET (HIGH) | NOT SET (HIGH) |

FIG. 5

SYSTEM AND METHOD FOR TESTING FUSE BLOW RELIABILITY FOR INTEGRATED CIRCUITS

BACKGROUND

An integrated circuit may include redundant components that can be used to substitute damaged componentry. For example, one type of memory circuit includes a dynamic random access memory (DRAM) array of memory cells. The memory cells are arranged in rows and columns, each of which is addressable for purposes of storing a bit of information. As the density of memory cells increase, the number of faulty cells also increases during the fabrication process. To reduce the effect of faulty cells, redundant memory cells, or rather redundant sections of memory cells may be used to repair a damaged section of the array, wherein the damaged section includes one or more damaged memory cells.

A testing process is implemented to determine whether a section of the memory is damaged. In that manner, it can be determined which rows and columns of memory cells, and more particularly, which sections of the memory array, need to be repaired. The testing process may be implemented externally from the device containing the memory array, or internally using failure diagnosis circuitry built into the device (e.g., integrated circuit including the memory device).

Once a damaged section of the integrated circuit is identified, the repair process includes replacing the damaged section with a redundant resource. For instance, in the memory array, selection of the redundant section may be achieved through the application of fuse circuitry. More specifically, a fuse that is associated with a redundant section may be blown, such that when the fuse is intact, the original but later damaged section of memory is accessed for memory storage, but when the fuse is blown, the redundant section is then used for memory storage instead of the damaged section. Various techniques may be used to program the memory array for repair, and more particularly to blow the fuse for selection of the redundant section. All of these techniques have associated failure rates, in which the selected fuse is only partially blown and not fully blown.

In the case of a partially blown fuse, the integrity of the memory array is at risk. A partially blown fuse may in some cases still allow the use of the damaged section of the memory array, instead of the desired redundant section. In other cases, the partially blown fuse works properly, but only temporarily, as the redundant section is selectable over the damaged section. However, over time, the partially blown fuse will return to its original state and act as an intact fuse, at least with regards to the memory controller used for selecting between the damaged and redundant sections of the memory array. For instance, the partially blown fuse may undergo passive oxidation, which will tend to return the fuse to its original state (e.g., intact and unblown).

During the repair process, a test may be performed to check whether the fuse has been blown. However, these tests are not designed to detect partially blown fuses. As such, a partially blown fuse under traditional testing will appear to be fully blown, when in fact the opposite is true. In that case, because the partially blown fuse still looks like an intact fuse to the memory controller, the damaged section of the memory is improperly used for memory access and control, instead of the intended selection of the redundant section. This will introduce storage errors as information continues to be stored in the damaged section of the memory array.

SUMMARY

Embodiments of the present invention generally relate to integrated circuits and fuse circuitry which is capable of providing post fabrication repair through the selection of redundant portions of circuitry through a corresponding blown fuse. For instance, the integrated circuit may include a memory structure, such as a DRAM array of memory cells, wherein the memory structure includes redundant portions. When a faulty portion of the memory array is discovered, a corresponding redundant portion is selectable through the blowing of a fuse using any available means (e.g., laser trimming, electrical signaling, etc.). Embodiments of the present invention provide a circuit and method for testing the reliability of the fuse blow condition, or put another way, the reliability that the fuse is fully blown, and not just partially blown. As such, embodiments of the present invention are capable of discovering when a fuse is partially blown.

In one embodiment, a fuse blow detection circuit includes a fuse circuit comprising a fuse having a first end coupled to ground. A common node is coupled to the second end of the fuse. A pre-charge circuit is coupled to the common node for pre-charging the common node to a pre-charged HIGH level. An inverter includes an inverter output and an inverter input, wherein the inverter input is coupled to the common node. A feedback latch is coupled between a voltage source and ground, and includes a latch input that is coupled to the inverter output and a latch output coupled to the common node. A test circuit is included that is coupled to the common node, wherein in a normal mode the test circuit adds strength to the feedback latch for purposes of maintaining the common node at the pre-charged HIGH level, such that in a test mode the feedback latch is weaker than in the normal mode for purposes of maintaining the common node at the pre-charged HIGH level.

In another embodiment, a method for testing the reliability of a fuse blow condition of a fuse is disclosed. The method includes providing a fuse circuit including a first end coupled to ground and a second end coupled to a common node. An inverter circuit is provided which includes an inverter output and an inverter input, wherein the input is coupled to the common node. A feedback latch is provided that is coupled between a voltage source and ground, wherein the feedback latch includes a latch input coupled to the inverter output and a latch output coupled to the common node. A test circuit is provided that is coupled to the common node. In a normal mode the test circuit adds strength to the feedback latch for purposes of maintaining the common node at the pre-charged HIGH level, such that in a test mode the feedback latch is weaker than in the normal mode for purposes of maintaining the common node at the pre-charged HIGH level.

In still another embodiment, a fuse blow detection circuit includes a fuse circuit that comprises a fuse having a first end coupled to ground and a second end coupled to a common node. The fuse circuit includes an addressable transistor coupled in series to the fuse between the common node and the first end. A pre-charge circuit is coupled to the common node for driving or pre-charging the common node to a pre-charged HIGH level. The detection circuit includes an inverter having an inverter output and an inverter input, wherein the inverter input is coupled to the common node. A feedback latch circuit is provided and includes a p-channel metal oxide field effect transistor (MOSFET) having a gate coupled to the output, a source coupled to a voltage source, and a drain coupled to the common node. The feedback latch circuit includes an n-channel MOSFET having a gate coupled to the inverter output, a source coupled to the common node, and a drain coupled to the ground. The fuse blow detection circuit also includes a test circuit comprising a contribution transistor having a gate coupled to the inverter output and a drain coupled to the common node. The test circuit also includes a switch transistor having a source coupled to the voltage source, a drain coupled to the source of the contribution transistor and a gate controlled by a test mode signal.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 5 is a chart illustrating a normal mode and a test mode implementable for a fuse blow detection circuit, and the status of a latch within the detection circuit under various resistive conditions of a fuse, such as a low resistance of the fuse corresponding to a no blow or intact condition of the fuse; a medium resistance of the fuse corresponding to a weak or partial blow condition of the fuse; and a high resistance of the fuse corresponding to a strong blow condition of the fuse.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure provide a circuit and method for testing the reliability of blowing a fuse in an integrated circuit. For instance, a fuse may be blown to incorporate redundant componentry into the integrated circuit over a damaged or faulty portion. As an example, a memory array structure (e.g., DRAM memory array) may include redundant portions that are selectable through blowing (to an open circuit) of corresponding fuses. After the fuse is blown, embodiments of the present invention are able to test the reliability that the fuse is fully blown, and not just partially blown. As such, embodiments of the present invention are capable of detecting when a fuse is partially blown.

Embodiments of the present invention are disclosed within the context of integrated circuits and fuse circuitry that is implementable for various functions, such as the repair of damaged portions of the integrated circuits. For instance, the integrated circuit may include a memory array, wherein the fuse circuitry is selectable for repairing damaged portions of the memory array. Testing the reliability of a blown fuse to operationally select a redundant portion for use within the memory array instead of a damaged portion is essential for error-free operation of the memory array.

Embodiments of the present disclosure are disclosed within the context of electrical circuitry which uses voltages to represent between two binary logic levels. The use of the terms "HIGH" and "LOW" are intended to represent false and true binary logic levels within a particular circuit. In that manner, logic levels within a fuse blow detection circuit help determine when a fuse is intact, fully blown, or partially blown.

Figure 1:
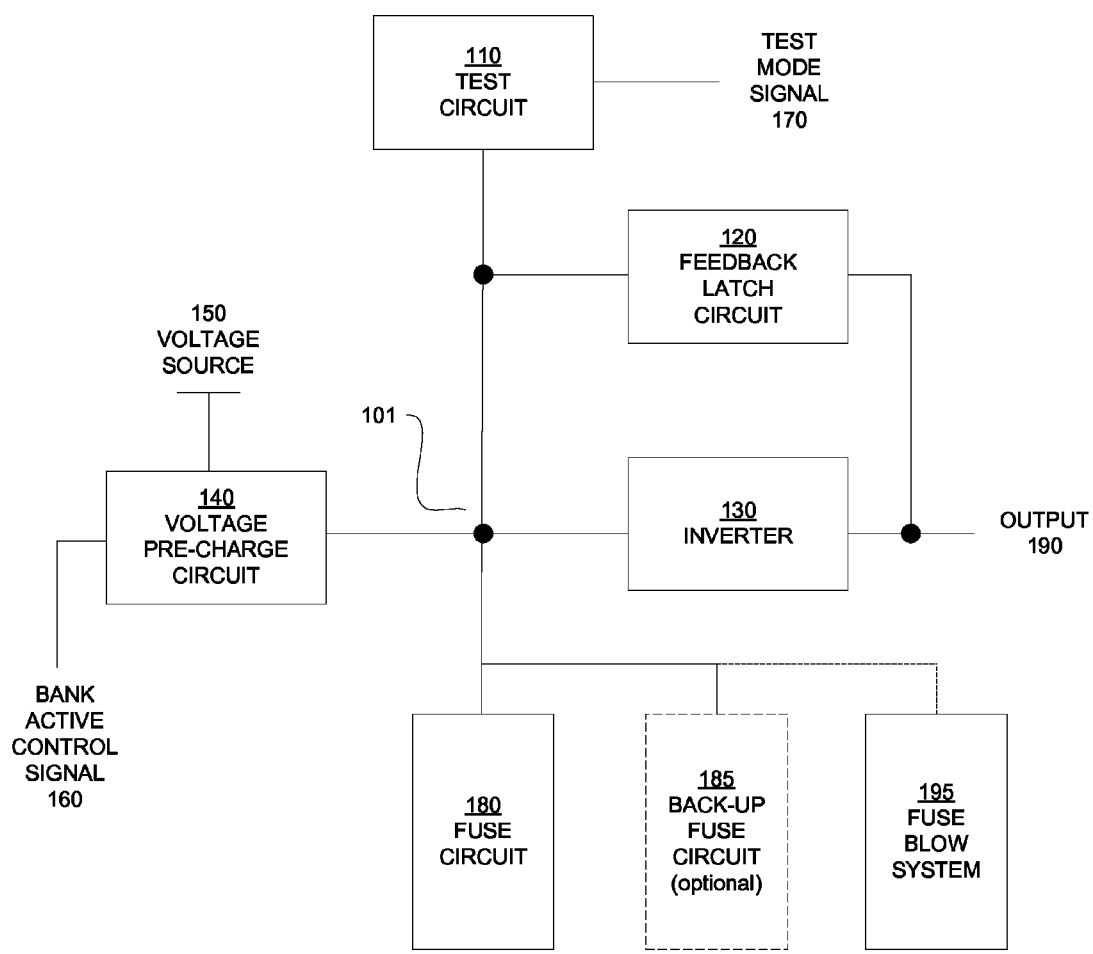
FIG. 1 is a block diagram of a fuse blow detection system and/or circuit for testing the reliability of the blowing of a fuse in an integrated circuit, in accordance with one embodiment of the present disclosure.

FIG. 1 is a block diagram of a fuse blow detection system and/or circuit 100 capable of testing the reliability of the blowing of a fuse in an integrated circuit, or put another way testing the reliability of the status of a blown fuse, in accordance with one embodiment of the present disclosure. As such, the fuse blow detection circuit 100 is implementable to detect multiple conditions of a fuse, to include a no blow condition for a fuse having low resistance; a strong blow condition for a fuse having a high resistance, and a weak or partial blow condition for a fuse having a medium resistance. In particular, embodiments of the present invention are able to detect the third condition of the fuse, or the partially blown condition, whereas previously under traditional testing systems and methods only the strong blow and the no blow conditions were testable.

As shown in FIG. 1, the detection circuit includes a fuse circuit 180. The fuse circuit 180 includes at least one fuse having a first end coupled to ground, and a second end that is coupled to a common node 101. In addition, the fuse circuit includes an addressable transistor that is coupled in series to the fuse between the common node of the detection circuit and the first end of the fuse. In that manner, a particular fuse is selectable for testing its configuration status, or for testing the reliability of a fuse blow condition of that fuse.

The fuse circuit 180 includes one or more fuses, each of which is selectable for performing a particular function. For instance, in the case of an integrated circuit that includes a memory array (e.g., DRAM memory array), the memory array may include redundant portions that are selectable to replace corresponding faulty or defective portions of the memory array. That is, when a portion of the memory array is determined to be damaged, a corresponding fuse is selectable to substitute the redundant portion of the memory array for the damaged or defective portion. Incorporation of the redundant portion of the memory array is achieved by fully blowing the corresponding fuse, in one embodiment. In that manner, a repair system, memory controller, microprocessor, or any suitable device capable of performing access and control over the memory array is able to recognize that the corresponding fuse is blown, and that the redundant portion of the memory array is to be used, over the damaged portion, during normal operations of the memory array.

The detection circuit 100 also includes a pre-charge circuit 140 that is coupled to the common node 101. The pre-charge circuit 140 is coupled to a voltage source 150 (e.g., Vcc), and to a bank active control signal 160. The pre-charge circuit 140 is activated in order to pre-charge the common node to a HIGH level. That is, before testing any fuse within the fuse circuit 180, the initial state of the detection circuit includes pre-charging the common node to a HIGH level. More particularly, the pre-charge circuit 140 includes a pre-charge transistor (not shown) having a source coupled to the voltage source 150 and a drain coupled to the common node. The pre-charge transistor is controlled by the bank active signal 160 for setting the common node to the pre-charged HIGH level, using the voltage source 150.

An inverter 130 is included within the detection circuit 100. The inverter includes an inverter output and an inverter input. The inverter input is coupled to the common node 101, and the inverter output is coupled to the output node 190.

A feedback latch circuit 120 is coupled between the voltage source 150 and ground. The feedback latch 120 includes a latch input coupled to the inverter output or output node 190. The feedback latch 120 also includes a latch output that is coupled to the common node. The feedback latch 120, when not set helps to maintain the common node at its pre-charged HIGH level. However, when set, the feedback latch 120 helps to drive the common node LOW and to maintain the common node at the LOW level.

The detection circuit 100 includes a test circuit 110 that is coupled to the common node 101. In a normal mode, the test circuit 110 adds strength to the feedback latch 120 for purposes of maintaining the common node 101 at the pre-charged HIGH level. That is, in a normal mode, the test circuit 110 is activated by asserting a test mode signal 170. In the normal mode, the feedback latch 120 is relatively strong, and it takes more current through a selected fuse to flip the feedback latch 120. A partially blown fuse, in a normal mode will not conduct enough current to drive the common node 101 to ground and set the feedback latch 120. As such, in the normal mode, a partially blown fuse under test will look like it is fully blown because it cannot conduct enough current through the fuse to drive the common node 101 to ground and also set the feedback latch 120 to help maintain the common node 101 at ground.

Conversely, the test circuit 110, in a test mode of the detection circuit 100, makes the feedback latch 100 weaker in comparison to its strength in the previously introduced normal mode for purposes of maintaining the common node at the pre-charged HIGH level. That is, in a test mode, the test circuit is de-activated by not asserting the test mode signal 170. As such, in a test mode, without the test circuit 110 contributing to the operation of the feedback latch 120, it takes less current through a selected fuse to flip the feedback latch 120, which indicates that the fuse is not blown, or that it is partially blown.

In addition, the fuse detection circuit 100 also includes an optional back-up fuse circuit 185. In one embodiment, the back-up fuse circuit may be coupled in parallel to the fuse circuit 180 to operate as a redundant fuse circuit in case the original fuse circuit 180 is damaged or defective. In particular, the back-up fuse circuit 185 includes a back-up fuse that operates as a redundant fuse, and is configurable to replace or substitute a corresponding fuse in the fuse circuit 180 in case that fuse is damaged. The back-up fuse may be implemented when a blown fuse is discovered under test to be partially blown, instead of fully blown. In that case, the back-up fuse is coupled in parallel to a corresponding original fuse. As such, the back-up fuse includes a first end that is coupled to ground and a back-up addressable transistor coupled in series to the back-up fuse between the common node and the first end of said back-up fuse.

Also, the fuse detection circuit 100 includes a fuse blow system 195 implementable for blowing a selected fuse. Various techniques may be used to program an integrated circuit, and more particularly to blow the fuse to an open circuit for implementation of a particular function, such as, the selection of the redundant portion of the integrated circuit. For instance, the integrated circuit may be a memory array including redundant portions, and the condition of a fuse indicates the inclusion or non-inclusion of a redundant portion of the memory array. In one embodiment, laser trimming is performed to blow a selected fuse (e.g., to an open circuit). In this case, the fuse blow system 195 is not necessarily electrically coupled to the fuse circuit 180, as the laser is trained onto the selected fuse for trimming. In another embodiment, electrical fuse selection and blowing is performed, wherein an electrical signal is used to select a fuse, and to blow the selected fuse. In this case, the fuse blow system 195 is electrically coupled to the fuse circuit 180.

Figure 2:
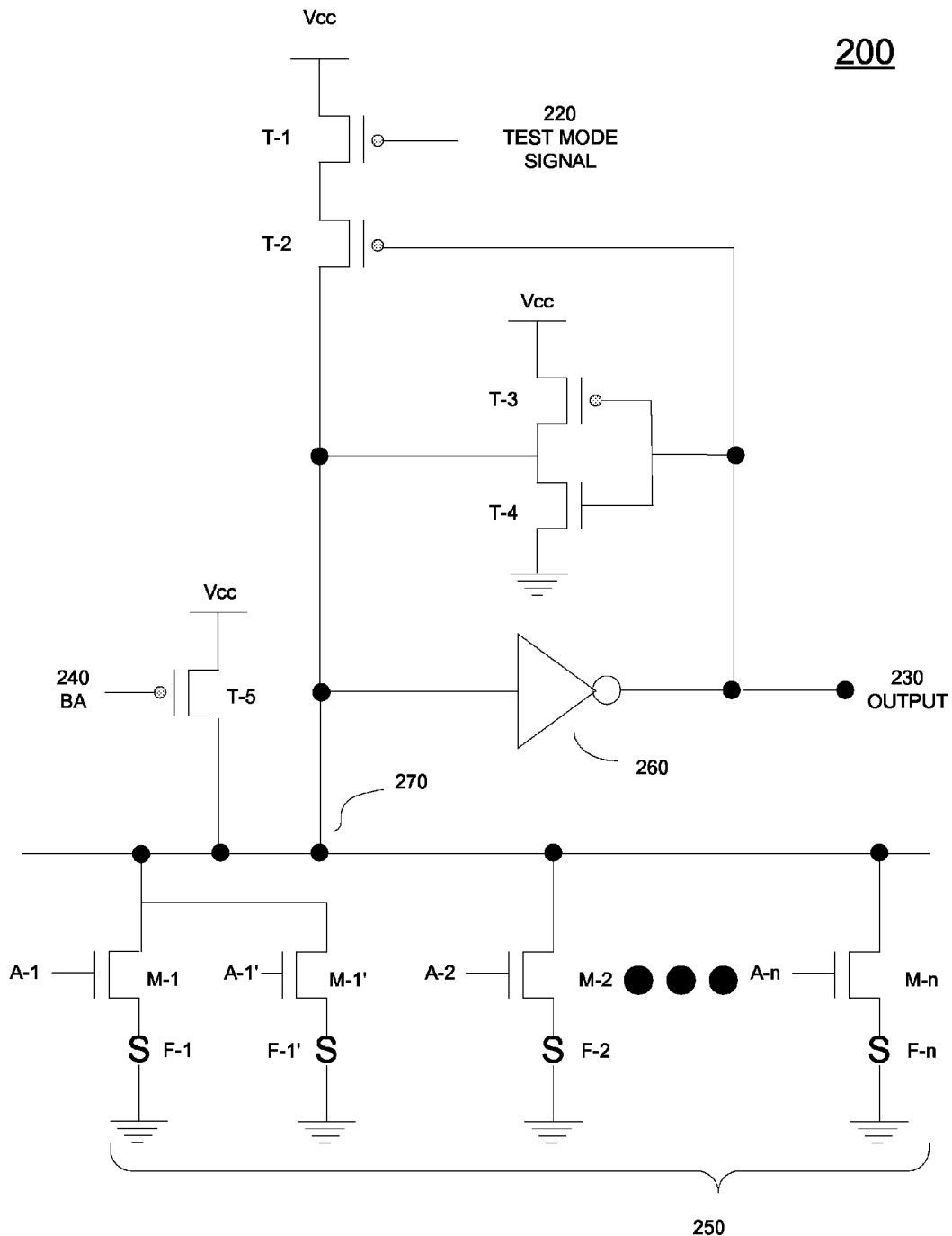
FIG. 2 is a circuit diagram of a fuse blow detection circuit capable of testing the reliability of the blowing of a fuse in an integrated circuit, in accordance with one embodiment of the present disclosure.

FIG. 2 is a circuit diagram of a fuse blow detection circuit 200 capable of testing the reliability of the blowing of a fuse in an integrated circuit, or for testing the reliability of the status of a blown fuse, in accordance with one embodiment of the present disclosure. In particular, the fuse blow detection circuit 200 in embodiments of the present invention is able to detect when a fuse is in a partial blown condition. Also, the fuse blow detection circuit 200 is able to detect when the fuse is in a strong blow condition, as well as a no blow condition.

As shown in FIG. 2, the detection circuit 200 includes at least one fuse circuit. The detection circuit 200 includes a plurality of fuse circuits 250, each of which includes an addressable MOSFET transistor coupled in series with a fuse. Fuses may be selected to be blown for performing a particular function, such as, blowing a fuse to select a redundant portion of a memory array to replace a defective portion, as previously discussed. In that manner, a repair system, memory controller, microprocessor is able to detect when a fuse is blown and then to incorporate a redundant portion of the memory array in place of the corresponding defective portion of the memory array.

In particular, a representative fuse circuit in FIG. 2 includes a fuse F-1 having a first end that is coupled to ground, and a second end that is coupled to a common node 270. More particularly, the second end is coupled to the drain of the addressable MOSFET M-1. Further, the addressable transistor M-1 includes a source that is coupled to the common node. A signal A-1 is asserted to address the transistor M-1 for purposes of testing the configuration status of the fuse F-1, as well as for testing the reliability of the fuse blow condition of the fuse F-1.

The detection circuit 200 includes additional fuse circuits in the plurality 250, such as, fuse F-2 coupled to addressable transistor M-2, which is selectable through the assertion of A-2, on up to fuse F-n coupled to addressable transistor M-n, which is selectable through the assertion of A-n. Each of the fuse circuits is coupled in parallel between the common node 270 and ground, and is separately addressable to perform different functions, such as, enable different redundant portions of a memory array.

In addition, a fuse circuit may include a back-up or redundant fuse circuit. The redundant fuse circuit may be used to replace a defective fuse circuit. For instance, as shown in FIG. 2, a back-up fuse circuit includes fuse F-1' and transistor M-1', wherein fuse F-1' is addressable for testing by asserting the signal A-1'. The back-up fuse circuit is coupled in parallel to the original fuse circuit, which includes fuse F-1 and transistor M-1, wherein the original fuse F-1 is addressable for testing by asserting signal A-1.

The detection circuit 200 also includes a pre-charge circuit that is coupled to the common node 270 for pre-charging the common node 270 to a HIGH level. As shown in FIG. 2, the pre-charge circuit includes a pre-charge MOSFET T-5 having a source coupled to a voltage source (e.g., Vcc), and a drain coupled to the common node 270. The pre-charge transistor T-5 is controlled by a bank active signal 240 for setting the common node 270 to a pre-charged HIGH level, as influenced by the voltage source Vcc. As such, in an initial state of the detection circuit 200, the common node is pre-charged to the HIGH level. In one embodiment, the transistor T-2 is relatively strong when compared to other transistors in circuit 200, and in one implementation the transistor T-5 has width and length dimensions of 2.0 over a minimum length in micrometers.

An inverter 260 is included within the detection circuit 200. The inverter is includes an inverter output and an inverter input, wherein the inverter input is coupled to the common node 270, and the inverter output is coupled to the output node 230. As shown inverter 260 inverts the signal coming into the inverter input from the common node 270. In one implementation, the transistor width Wn of the n-channel MOSFET in the inverter 260 is 1.0 µm over a minimum length, and the transistor width Wp of the p-channel MOSFET in the inverter 260 is also 1.0 µm over a minimum length.

Detection circuit 200 includes a feedback latch circuit that is coupled between the voltage source (e.g., Vcc) and ground. The feedback latch includes a latch input coupled to the inverter output or output node 230, and a latch output that is coupled to the common node 270. In particular, in part, the feedback latch includes a p-channel MOSFET T-3 having a gate that is coupled to the output node 230, a source coupled to the voltage source (e.g., Vcc), and a drain coupled to the common node 270. In addition, the feedback latch includes an n-channel MOSFET T-4 having a gate that is coupled to the inverter output or output node 230, a source coupled to the common node 270, and a drain coupled to ground. In general, the feedback latch helps to maintain the common node at its pre-charged HIGH level. However, when the latch is set, the feedback latch then helps to drive and maintain the common node 270 to a LOW level. In one implementation, the p-channel transistor T-3 has width/length dimensions of 0.8/3.2 in micrometers.

In addition, the detection circuit 200 also includes a test circuit including a contribution MOSFET T-2 and a switch MOSFET T-1. The contribution transistor T-2 includes a gate that is coupled to the inverter output or output node 230, and a drain coupled to the common node 270. The switch transistor T-1 includes a source coupled to the voltage source (e.g., Vcc), a drain coupled to the source of the contribution transistor T-2, and a gate controlled by the test mode signal 220. In one implementation, the transistor T-1 has width and length dimensions of 1.0/0.1 in micrometers. Also, in another implementation the transistor T-2 has width/length dimensions of 0.8/1.5 in micrometers. The various dimensions for the various transistors and inverters used in the circuit 200 are selectable to bias the detection circuit to control the sensitivity of detecting weakly resistive fuses, in various embodiments.

More particularly, the switch transistor T-1 activates a normal mode or a test mode of the detection circuit. In a normal mode, the switch transistor T-1 is turned ON through the assertion of the test mode signal 220 (e.g., assert signal 220 to LOW), so that the contribution transistor T-2 makes a contribution to the feedback latch described above. In that manner, the feedback latch is relatively strong because of the dual contributions of the p-channel transistors T-2 and T-3, which helps to maintain the common node 270 at a HIGH level, even when a fuse is partially blown. That is, since the feedback latch is relatively strong, it takes more current to drive the common node to ground through a selected fuse circuit, and as such, a weakly resistive fuse (e.g., partial blown fuse) is unable to conduct enough current to drive the common node 270 to ground in the normal mode, and acts similarly to a fully blown fuse to the detection circuit 200. As such, the weakly resistive fuse is unable to set the feedback latch, so the common node remains at its pre-charged HIGH level. In addition, given a LOW at the output node 230, the p-channel transistors T-2 and T-3 feedback latch helps to maintain the common node at the HIGH level, whereas the n-channel transistor T-4 is inactive.

On the other hand, in a test mode, the switch transistor T-1 is turned OFF by not asserting the test mode signal 220 (e.g., assert signal 220 to HIGH), so that the contribution transistor T-2 is then inactive and is unable to make a contribution to the feedback latch described above. In that manner, the feedback latch is relatively weak, in comparison to its operation in normal mode, because only one p-channel transistor T-3 is included in the latch. As such, the feedback latch weakly keeps the common node at its pre-charged HIGH level. That is, since the feedback latch is relatively weak, it now takes less current (when compared to the normal mode operation of the detection circuit) to drive the common node to ground through a selected fuse circuit, and as such, the same weakly resistive fuse (e.g., partially blown fuse) is now able to conduct enough current to drive the common node 270 to ground in the test mode. The fuse now does act differently than a fully blown fuse to the detection circuit 200, and can be detected as a partially blown fuse. More particularly, the weakly resistive fuse is now able to set the feedback latch, so the common node now is driven LOW through the conduction of current through the weakly resistive fuse. In addition, given a HIGH at the output node 230, the p-channel transistor T-2 is now turned OFF, and the n-channel transistor T-4 helps maintain the common node at the LOW level.

Figure 3:
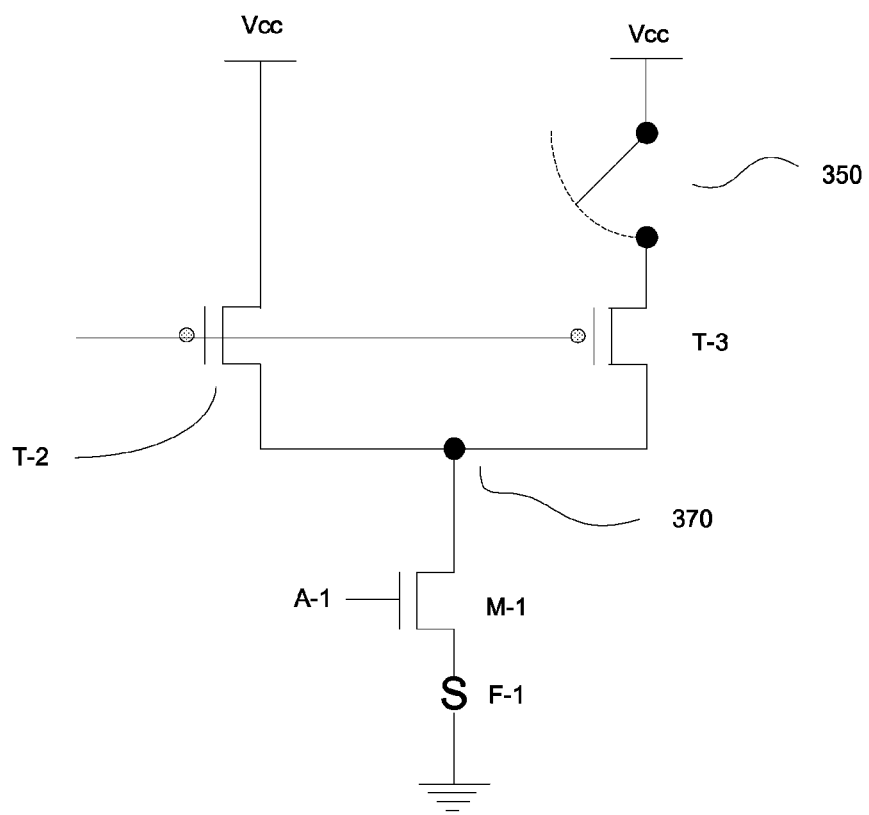
FIG. 3 is a reduced circuit diagram focusing on the contributions of a test circuit during normal and test modes, wherein the test circuit is included as part of a fuse blow detection circuit, in accordance with one embodiment of the present disclosure.

FIG. 3 is a reduced circuit diagram of a fuse detection circuit 300 focusing on the contributions of a test circuit included in circuit 300 during normal and test modes when operating on a particular fuse circuit, wherein the test circuit is included as part of a fuse blow detection circuit, in accordance with one embodiment of the present disclosure. In one embodiment, the fuse detection circuit 300 is a reduction of the fuse detection circuit of FIG. 2, and as such includes similarly referenced transistors, fuses, and addressing signals.

As shown in FIG. 3, a fuse circuit includes a fuse F-1 and an addressable transistor M-1, wherein transistor M-1 is addressable through the assertion of signal A-1 for purposes of testing the reliability of a blow condition of fuse F-1. Transistor M-1 is coupled to common node 370.

Also, the feedback latch is shown and includes two transistors T-2 and T-3 coupled in parallel between the voltage source (e.g., Vcc) and the common node 370. For purposes of illustration and clarity, the output node and its various connections are not fully represented.

In particular, in a normal mode, the switch 350 is asserted to close the circuit such that transistor T-2 is active and coupled in parallel to transistor T-3, as previously described. As such, the feedback latch includes both transistors T-2 and T-3 for purposes of helping maintain the common node at a pre-charged HIGH level. In a test mode, the switch operates as an open circuit, thereby rendering transistor T-2 inactive.

As such, the feedback latch now only includes transistor T-2 for purposes of helping maintain the common node at a pre-charged HIGH level. That is, in a normal test mode transistor T-2 adds strength to the feedback latch for purposes of maintaining the common node at the pre-charged HIGH level.

However, in a test mode, because the contribution of transistor T-2 is negated the feedback circuit only includes transistor T-3 coupled to the common node. Because there is only one p-channel transistor T-3, the feedback latch is now weaker than in the normal mode for purposes of maintaining the common node at the pre-charged HIGH level. That is, the feedback latch more easily sets, because less current is required to flow through fuse M-1 (such as, when the fuse is weakly resistive as in a partial blown condition) in order to bring the common node LOW.

Figure 4:
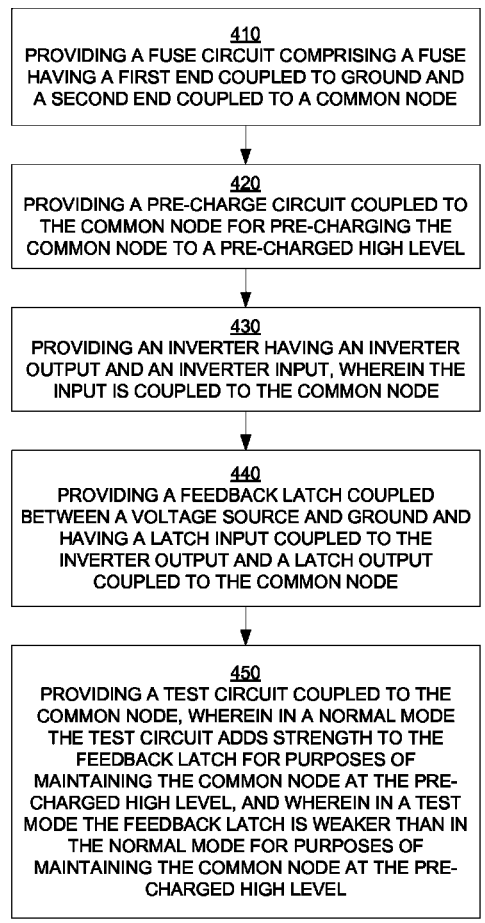
FIG. 4 is a flow chart illustrating a method for detecting the reliability of a fuse blow condition, in accordance with one embodiment of the present disclosure.

FIG. 4 is a flow chart 400 of a process used for testing the reliability of a fuse blow condition, and more particularly, the reliability that the fuse is fully blown, in accordance with one embodiment of the present disclosure. The method of flow chart 400 is implementable to detect when a fuse has been partially blown for a fuse having a medium resistance. In addition, the method of flow chart 400 is equally applicable to detect other conditions of the fuse, such as, a no blow condition for a fuse having low resistance and a strong blow condition for a fuse having a high resistance, whereas previously under traditional testing systems and methods only the strong blow and the no blow conditions were testable.

At 410, a fuse circuit is provided, and includes a fuse having a first end coupled to ground and a second end coupled to a common node. In one embodiment, the fuse is selectable for purposes of testing its reliability. For instance, the fuse circuit includes an addressable transistor that is coupled in series to the fuse between the common node and the first end. As such, the fuse is addressable for testing purposes when the addressable transistor is activated or addressed.

At 420, a pre-charge circuit is provided, and is coupled to the common node. The pre-charge circuit brings the common node up to a pre-charged HIGH level. In addition, at 430, an inverter is provided having an inverter output and an inverter input. In particular, the inverter input is coupled to the common node. Also, the inverter output is coupled to an output node.

At 440, a feedback latch is provided, and is coupled between a voltage source and ground. The feedback latch includes a latch input that is coupled to the inverter output or output node. The feedback latch also includes a latch output that is coupled to the common node.

At 450, a test circuit is provided, wherein the test circuit is also coupled to the common node, and is used to activate a normal mode or test mode. In a normal mode, the test circuit adds strength to the feedback latch, as previously described in FIGS. 1-3, for purposes of maintaining the common node at the pre-charged HIGH level. For instance, the normal mode of the detection circuit is activated through assertion of a signal (e.g., test mode signal of FIG. 2). More particularly, in the normal mode two or more MOSFETS are coupled in parallel within the feedback latch, that combined help maintain the common node at the HIGH level.

However, in a test mode, the feedback latch is weaker than in the normal mode for purposes of maintaining the common node at the pre-charged HIGH level. For instance, to activate the test mode of the detection circuit, the test mode signal is not activated. As such, only one MOSFET is included within the feedback latch, or at least lesser numbers of MOSFETS are coupled in parallel in the feedback latch than in the normal mode. In one embodiment, the test circuit is de-activated to negate the contributions of the transistors in the test circuit in the feedback latch. As such, because there is only one transistor, in the test mode the feedback latch weakly maintains the common node at the pre-charged HIGH level, and is susceptible to being set with a smaller amount of current flowing through the selected fuse, such as, when the fuse is in a partial blown condition.

In one embodiment, a selected fuse is determined to be partially blown through implementation of the method outlined in flow chart 400. In particular, the fuse is blown through any suitable fuse blow process. For instance, a laser trimming technique may be used to blow the fuse, or an electrical fuse blow programming technique may be used. It is desired to test the reliability of a fuse blow condition associated with the blown fuse. In particular, the fuse is tested in a normal mode. The reliability of the results from that test may be suspect, and as such, the fuse is then tested again in a test mode. Particularly, it is determined that the fuse is partially blown when in the normal mode the inverter output at the output node is at a LOW level (e.g., the common node is HIGH), and in the test mode the inverter output at the output node is at a HIGH level (e.g., the common node is LOW). Additionally, under different conditions, it may be determined that the fuse is effectively partially blown, or not blown at all, when in the normal mode, the output at the output node is immediately at a HIGH level (e.g., the common node immediately goes LOW).

When it is determined that the fuse is partially blown, the method outlined in FIG. 4 may include the employment of a back-up fuse circuit to replace the defective fuse. That is, the back-up fuse circuit is coupled in parallel to the defective fuse circuit, and may be alternatively selectable. In that manner, the defective fuse is not further considered, and any processes associated with the defective fuse is implemented on the back-up fuse circuit.

In another embodiment, the integrity of the fuse may be checked. That is, a configuration check is performed. For instance, the integrity is determined to be intact when in a normal mode, the inverter output is at a HIGH level. For further confirmation, in a test mode, the inverter output is also at the HIGH level. This indicates that the fuse is fully intact. On the other hand, the integrity is determined to be compromised when in normal mode, the inverter output is at a LOW level. Further, the fuse may be determined to be partially blown, when in a test mode the inverter output is at a HIGH level.

FIG. 5 is a chart 500 illustrating a normal mode and a test mode implementable for a fuse blow detection circuit, and the status of a feedback latch within the detection circuit under various resistive conditions of a fuse, such as a low resistance of the fuse corresponding to a no blow or intact condition of the fuse; a medium resistance of the fuse corresponding to a weak or partial blow condition of the fuse; and a high resistance of the fuse corresponding to a strong blow condition of the fuse.

As shown in chart 500, three columns are included. Column 505 indicates the condition of the fuse, and more particularly a resistive condition of the fuse. For instance, for a no blow condition, the fuse has low resistance; for a weak or partial blow condition, the fuse has medium resistance; and for a strong blow condition, the fuse has a high resistance. Column 510 indicates results for a normal mode operation of the fuse blow detection circuit, and indicates whether the feedback latch circuit has set. Additionally, the voltage status of the common node is also indicated in parenthesis consistent with whether the feedback latch has set or not. Column 520 indicates results for a test mode operation of the fuse blow detection circuit, and indicates whether the feedback latch circuit has set. Voltage status of the common node under test mode is also provided in parentheses consistent with whether the latch has set or not.

Treating each condition of the fuse separately, row 530 provides reliability results for a fuse that is intact or is in a no blow condition. For instance, under a normal mode of operation of the fuse blow detection circuit and/or method, the feedback latch is able to set, such that the common node is at a LOW level. Because the fuse is intact, enough current is pulled through the fuse to set the latch, thereby forcing the common node LOW, and providing an inverter output of HIGH. The feedback latch maintains this LOW back to the common node. In addition, under a test mode of operation of the fuse blow detection circuit and/or method, the feedback latch is also able to set, such that the common node is driven to a LOW level. Because the fuse is intact, enough current is pulled through the fuse to set the latch, thereby forcing the common node LOW, and providing an inverter output of HIGH. The feedback latch maintains this LOW back to the common node.

Row 540 provides reliability results for a fuse that is weakly blown or is in a partially blown condition. For instance, under a normal mode of operation of the fuse blow detection circuit and/or method, the feedback latch is strong and is able to maintain the pre-charged HIGH at the common node, even if the fuse is partially blown. That is, because the feedback latch is strong more current than that supplied through the partially blown fuse is needed to set the feedback latch, and as such, the latch is not set. Under this scenario, the common node is maintained at the pre-charged HIGH level, and the inverter output is LOW. In addition, under a test mode of operation of the fuse blow detection circuit and/or method, the feedback latch is now able to set, such that the common node is driven LOW. That is, because the feedback latch is weaker than in the normal mode, less current through the partially blown fuse is needed to set the feedback latch, and as such, the latch now sets. Under this scenario, the common node is driven LOW, and the inverter output is HIGH.

Additionally, it may be immediately clear that a blown fuse is defective (e.g., fully intact or partially blown) when under a normal mode of operation of the fuse blow detection circuit and/or method, the feedback latch immediately sets, such that the common node is driven LOW. As such, even when the feedback latch is strong, enough current is able to conduct through the fuse to set the latch. Under this scenario, the common node is driven LOW, and the inverter output is HIGH. Since it is immediately understood that the fuse is defective, it is not necessary to subject the fuse to the test mode of operation, since the results should be duplicated.

Row 550 provides reliability results for a fuse that is in a strong blow condition. For instance, under a normal mode of operation of the fuse blow detection circuit and/or method, because the fuse is an open circuit, practically little or no current conducts through the fuse. As such, the common node remains in its pre-charged state at a HIGH level, and the inverter output is LOW. In a test mode, even though the feedback latch is weak, the fuse still presents an open circuit, and as such little or no current conducts through the fuse. As such, the common node again remains in its pre-charged state at a HIGH, and the inverter output is LOW.

Thus, according to embodiments of the present disclosure, circuits and methods for testing the reliability of the blowing of a fuse blowing of a fuse through a detection circuit used for detecting the reliability of the blowing of a fuse, wherein in a normal mode a partially blown fuse is not able to draw enough current to set a feedback latch thereby indicating that the fuse is blown, but in a test mode the same fuse is now able to draw enough current to set the feedback latch indicating that the fuse is partially blown.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:

1. A fuse blow detection circuit, comprising:
 a fuse circuit comprising a fuse having a first end coupled to ground;
 a common node coupled to a second end of said fuse;
 a pre-charge circuit coupled to said common node for pre-charging said common node to a pre-charged HIGH level;
 an inverter having an inverter output and an inverter input, wherein said inverter input is coupled to said common node;
 a feedback latch coupled between a voltage source and ground and having a latch input coupled to said inverter output and a latch output coupled to said common node; and
 a test circuit coupled to said common node, wherein in a normal mode said test circuit adds strength to said feedback latch for purposes of maintaining said common node at said pre-charged HIGH level, such that in a test mode said feedback latch is weaker than in said normal mode for purposes of maintaining said common node at said pre-charged HIGH level.

2. The detection circuit of claim 1, wherein said fuse circuit further comprises:
 an addressable transistor coupled in series to said fuse between said common node and said first end.

3. The detection circuit of claim 2, further comprising:
 a backup fuse circuit coupled in parallel to said fuse circuit and comprising a back-up fuse having a first end coupled to ground and a back-up addressable transistor coupled in series to said back-up fuse between said common node and said first end of said back-up fuse.

4. The detection circuit of claim 1, further comprising:
a pre-charge transistor having a source coupled to said voltage source and a drain coupled to said common node, wherein said pre-charge transistor is controlled by a bank active signal for setting said common node to said pre-charged HIGH level.

5. The detection circuit of claim 1, wherein said feedback latch comprises:
a p-channel field effect transistor (FET) having a gate coupled to said inverter output, a source coupled to said voltage source, and a drain coupled to said common node; and
an n-channel FET having a gate coupled to said inverter output, a source coupled to said common node, and a drain coupled to said ground.

6. The detection circuit of claim 5, wherein said test circuit comprises:
a contribution transistor having a gate coupled to said output and a drain coupled to said common node; and
a switch transistor having a source coupled to said voltage source, a drain coupled to said source of said contribution transistor and a gate controlled by a test mode signal.

7. The detection circuit of claim 6, wherein said p-channel FET has a width/length dimension of 0.8/3.2, and wherein said contribution transistor has a width/length dimension of 0.8/1.5.

8. The detection circuit of claim 6, wherein said test circuit is active during said normal mode and inactive during said test mode.

9. The method of claim 6, further comprising:
when it is determined that said fuse is partially blown, employing a back-up fuse circuit coupled in parallel to said fuse circuit and comprising a back-up fuse having a first end coupled to ground and a back-up addressable transistor coupled in series to said back-up fuse between said common node and said first end of said back-up fuse.

10. The detection circuit of claim 1, further comprising:
a fuse blow system coupled to said fuse that when activated blows said fuse to an open circuit.

11. A method for testing reliability of a fuse blow status of a fuse, comprising:
providing a fuse circuit comprising a fuse having a first end coupled to ground and a second end coupled to a common node;
providing a pre-charge circuit coupled to said common node for pre-charging said common node to a pre-charged HIGH level;
providing an inverter having an inverter output and an inverter input, wherein said input is coupled to said common node;
providing a feedback latch coupled between a voltage source and ground and having a latch input coupled to said inverter output and a latch output coupled to said common node; and
providing a test circuit coupled to said common node, wherein in a normal mode said test circuit adds strength to said feedback latch for purposes of maintaining said common node at said pre-charged HIGH level, such that in a test mode said feedback latch is weaker than in said normal mode for purposes of maintaining said common node at said pre-charged HIGH level.

12. The method of claim 11, further comprising:
addressing said fuse circuit by activating an addressable transistor coupled in series to said fuse between said common node and said first end.

13. The method of claim 10, further comprising:
signaling said normal mode of said test circuit; and
activating said test circuit.

14. The method of claim 12, further comprising:
signaling said test mode of said test circuit; and
de-activating said test circuit.

15. The method of claim 14, further comprising:
blowing said fuse;
determining that said fuse is partially blown when in said normal mode said inverter output is LOW, and when in said test mode said inverter output is HIGH.

16. The method of claim 12, further comprising performing a configuration check comprising:
in normal mode, determining that an integrity of said fuse is intact when said inverter output is HIGH; and
in normal mode, determining said fuse is compromised when said inverter output is LOW.

17. The method of claim 16, when determining that said fuse is compromised, further determining that said fuse is partially blown when in said test mode said inverter output is HIGH.

18. A fuse blow detection circuit, comprising:
a fuse circuit comprising a fuse having a first end coupled to ground and a second end coupled to a common node, and an addressable transistor coupled in series to said fuse between said common node and said first end;
a pre-charge circuit coupled to said common node for pre-charging said common node to a pre-charged HIGH level;
an inverter having an inverter output and an inverter input, wherein said inverter input is coupled to said common node;
a feedback latch comprising a p-channel field effect transistor (FET) having a gate coupled to said output, a source coupled to a voltage source, and a drain coupled to said common node, and an n-channel FET having a gate coupled to said inverter output, a source coupled to said common node, and a drain coupled to said ground; and
a test circuit comprising a contribution transistor having a gate coupled to said inverter output and a drain coupled to said common node, and a switch transistor having a source coupled to said voltage source, a drain coupled to said source of said contribution transistor and a gate controlled by a test mode signal.

19. The detection circuit of claim 18, wherein in a normal mode said test circuit adds strength to said feedback latch for purposes of maintaining said common node at said pre-charged HIGH level, such that in a test mode said feedback latch is weaker than in said normal mode for purposes of maintaining said common node at said pre-charged HIGH level.

20. The detection circuit of claim 18, wherein said pre-charge circuit further comprises:
a pre-charge transistor having a source coupled to said voltage source and a drain coupled to said common node, wherein said pre-charge transistor is controlled by a bank active signal for setting said common node to said pre-charged HIGH level.

21. The detection circuit of claim 18, further comprising:
a backup fuse circuit coupled in parallel to said fuse circuit and comprising a back-up fuse having a first end coupled to ground and a back-up addressable transistor coupled in series to said back-up fuse between said common node and said first end of said back-up fuse.

* * * * *